United States Patent
Huang (10) Patent No.: US 6,930,031 B2
(45) Date of Patent: Aug. 16, 2005

(54) BUMPING PROCESS (75) Inventor: Min-Lung Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/710,621

(22) Filed: Jul. 26, 2004

(65) Prior Publication Data
US 2005/0020050 A1 Jan. 27, 2005

(30) Foreign Application Priority Data
Jul. 25, 2003 (TW) ........................ 92120367 A (51) Int. Cl.⁷ .............................................. H01L 21/44
(52) U.S. Cl. ........................ 438/612; 438/613; 438/614; 438/615
(58) Field of Search ................... 438/612–615; 257/772, 779–780

(56) References Cited
U.S. PATENT DOCUMENTS 6,372,622 B1 * 4/2002 Tan et al. .................. 438/612
6,486,054 B1 * 11/2002 Fan et al. .................. 438/613
6,602,775 B1 * 8/2003 Chen et al. ................ 438/612
6,649,507 B1 * 11/2003 Chen et al. ................ 438/614

* cited by examiner

Primary Examiner—Lynne A. Gurley
(74) Attorney, Agent, or Firm—Jiang Chyun IP Office (57) ABSTRACT A bumping process is disclosed. The bumping process comprises the steps of: providing a wafer having a plurality of bonding pads and a passivation layer, wherein the passivation layer exposes the bonding pads; forming an UBM layer over the wafer to cover the bonding pads; forming two or more photoresist layers over the wafer, wherein the photoresist layers have different exposure and development characteristics; forming at least one or more stair-shaped openings in the photoresist layers by a single exposure corresponding to the bonding pads; filling solder into the stair-shaped openings to form a plurality of solder bumps; removing the entire photoresist layer. The bumping process can provide bumps with higher heights, so that the connection between chips and carriers becomes more reliable.

14 Claims, 8 Drawing Sheets

BUMPING PROCESS

CROSS REFERENCE TO RELATED APPLICATIONS

This application claims the priority benefit of Taiwan application serial no. 92120367, filed Jul. 25, 2003.

BACKGROUND OF INVENTION

1. Field of the Invention

The present invention relates to bumping process, and in particular, to a bumping process to fabricate bumps with the higher height which enhances connection reliability between chips and a carrier by way of a single exposure to form stair-shaped openings in the photoresist layer.

2. Description of the Related Art

In the modern world with abundant information, the market of multi-media application is thus continuously growing. The development of Integrated Circuits (IC) packaging technology should be in line with the development of electronic devices, including digitization, network development, local area connections and user friendliness of electronic devices. To meet the above requirements, capacities of high-speed processing, multi-function, miniaturization, lightweight and low cost for the electronic devices have to be improved.

Thus, IC package technology has been developed toward the purposes of small-scale and high density. Ball Grid Array (BGA) packages, Chip-Scale Package (CSP), Flip Chip (F/C) packages and Multi-Chip Module (MCM) packages are hence developed. The density of the IC package refers to the number of pins per unit area. In view of the high density IC package, reducing the length of wires improves signal transmission speed, and therefore, the application of bumps becomes the main stream of high-density package.

Figure 1A:
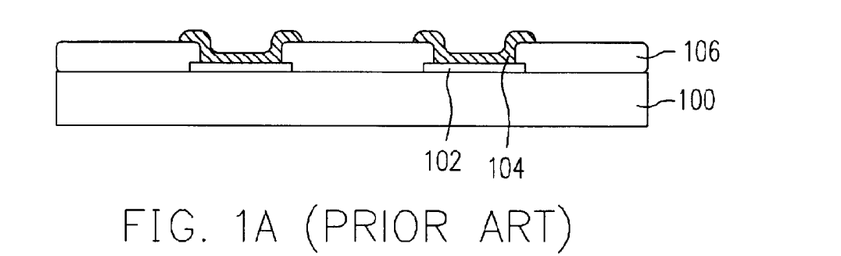
FIGS. 1A to 1F are schematic cross-sectional views of steps of a conventional bumping process.

FIGS. 1A to 1F are schematic cross-sectional views of steps for a conventional bumping process. Referring to FIG. 1A, a wafer 100 is first provided. A plurality of bonding pads 102 is formed on an active surface of the wafer 100. In addition, a passivation layer 106 is formed on the wafer 100, and the passivation layer 106 covers the active surface of the wafer 100 but exposes the bonding pads 102. Moreover, an under bump metallurgy (UMB) layer 104 is formed on the wafer 100, wherein the UBM layer 104 is disposed on the exposed surface of the bonding pads 102 and a portion of the passivation layer 106 around the bonding pads 102.

Figure 1B:
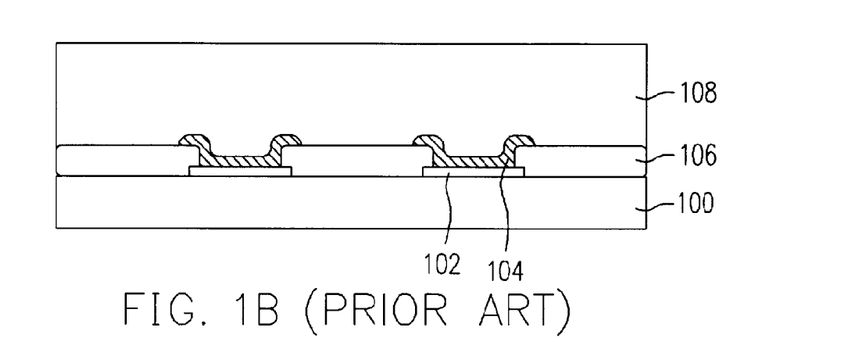
Figure 1C:
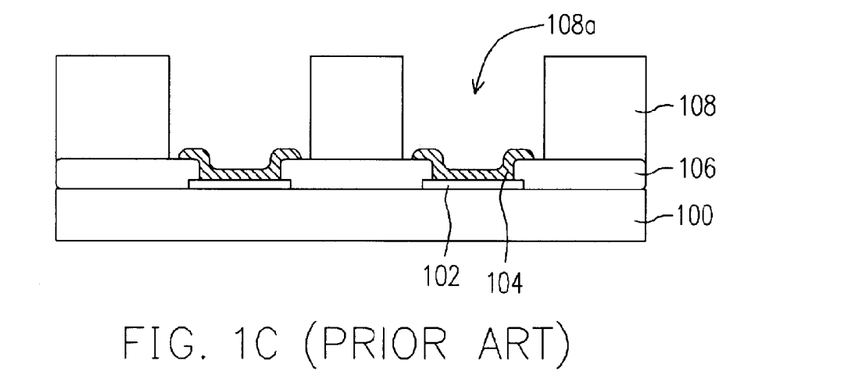

As shown in FIG. 1B, a photoresist layer 108 is formed on the active surface of the wafer 100. Thereafter, as shown in FIG. 1C, a plurality of openings 108a are formed in the photoresist layer 108 directly above the bonding pads 102 after photolithography and development. Through the openings 108a, a portion of the under-bump metallurgy (UBM) layer 104 is exposed.

Figure 1D:
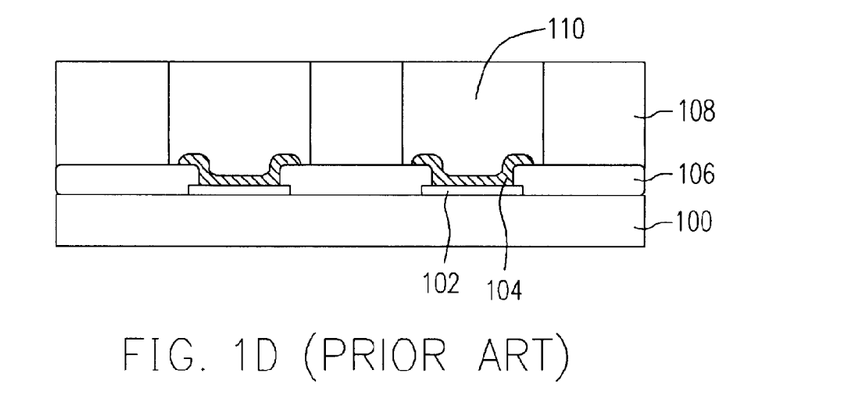
Figure 1E:
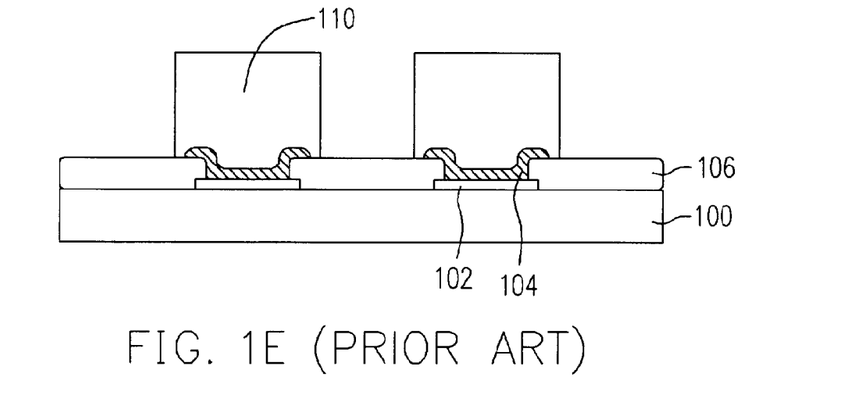

As shown in FIG. 1D, a solder material is filled into the openings 108a by stencil printing so that a plurality of solder posts 110 is formed over the UBM layer 104. Thereafter, as shown in FIG. 1E, the photoresist layer 108 is removed to expose the solder posts 110.

Figure 1F:
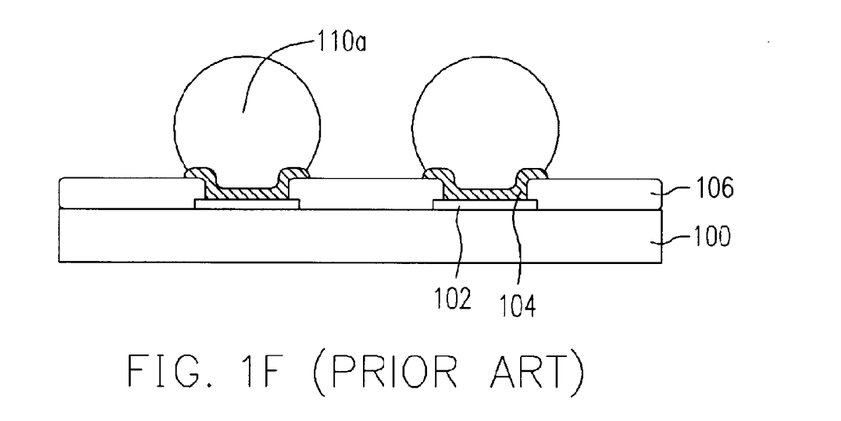

Finally, as shown in FIG. 1F, a reflow process is then performed. During the reflow process, since the solder posts 110 are in a partially melted state, spherical-like solder posts 110 are formed due to the cohesion thereof. Then, the spherical-like solder posts 110 are cooled and b a plurality of spherical bumps 110a is obtained on the UBM layer 104.

Figure 2:
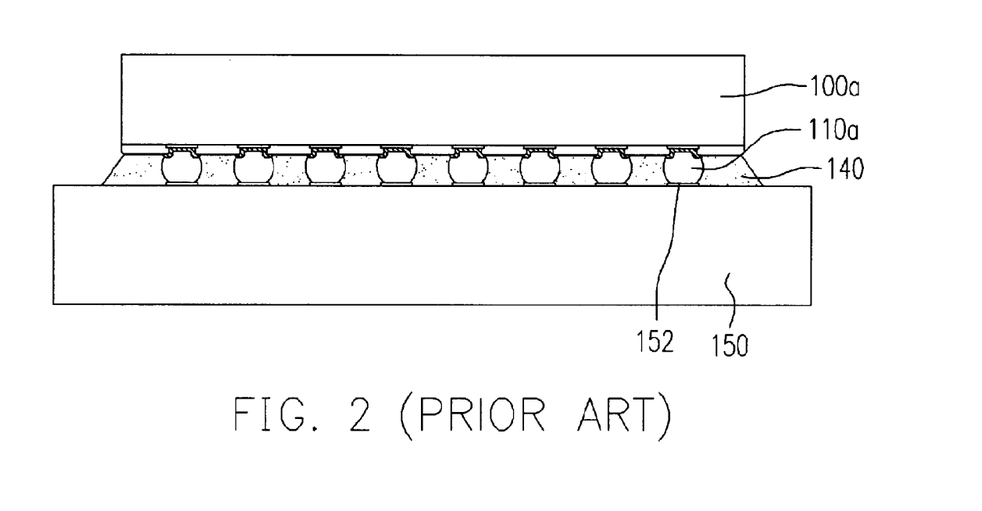
FIG. 2 is a schematic cross-sectional view showing the assembly between a chip and a printed circuit board after forming a plurality of bumps on the chip by the conventional bumping process.

FIG. 2 schematically shows the assembly between a chip and a printed circuit board, after forming bumps on the chip by the conventional bumping process. Referring to FIG. 1F and FIG. 2, after the bumping process is performed on the wafer 100 to form the bumps, the wafer 100 is sawed to form a plurality of separated chips 100a. Next, referring to FIG. 2, the chip 100a is bonded to a carrier 150 by flip chip bonding. The chip 100a is electrically connected to contacts 152 of the carrier 150 via the bumps 110a. The carrier 150 is, for example, a package substrate or a printed circuit board. Besides, an underfill 140 is filled between the chip 100a and the carrier 150 so as to protect the exposed surfaces of the bumps 110a.

It should be noted that during the heating process, the bumps are subjected to thermal strain resulted from the difference in coefficients of thermal expansion (CTE) for the carrier and the chip. When the shear stress exerted to the bumps exceeds the tolerance range, cracks will occur, which results in short between the chip and the carrier. Besides, due to the fact that the sidewalls of the opening in the photoresist layer are substantially perpendicular to the active surface of the wafer, the volume and the height of the bumps fabricated by the conventional bumping process are limited by the thickness of the photoresist layer. Thus, the bumps are easily damaged by the shear stress generated by thermal strain between the chip and the carrier, and the reliability of package is poor.

Figure 3A:
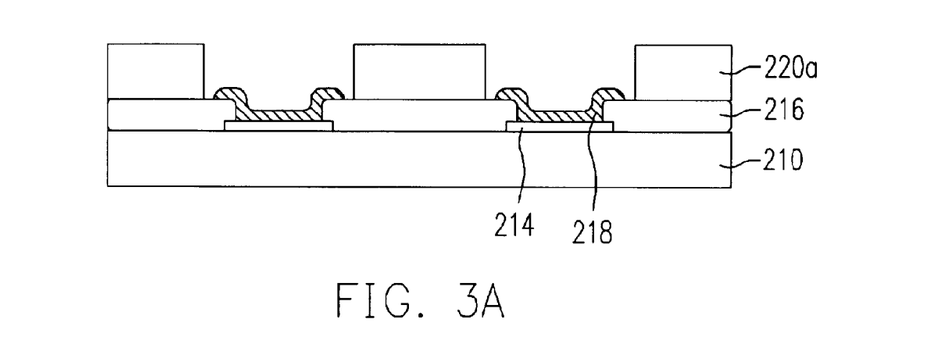
FIGS. 3A to 3F are schematic cross-sectional views of another conventional bumping process.
Figure 3B:
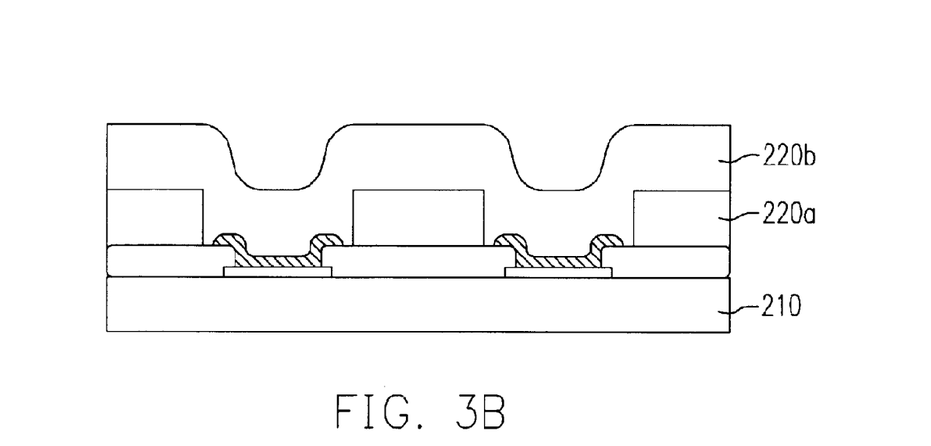
Figure 3C:
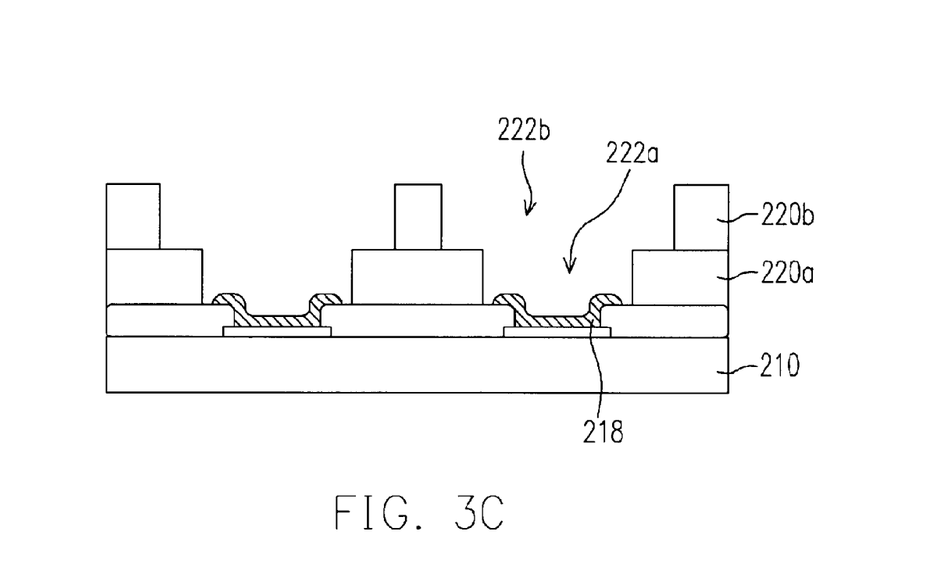

In order to overcome the above drawbacks, another conventional bumping process is proposed. FIGS. 3A to 3F are schematic sectional views of another conventional bumping process. Referring to FIG. 3A, a wafer 210 is first provided, and the wafer 210 has a plurality of bonding pads 214 thereon and a passivation layer 216 covering an active surface of the wafer 210. The passivation layer 216 exposes the bonding pads 214. Furthermore, an under bump metallurgy (UMB) layer 218 is formed over the wafer 210. The UBM layer 208 is disposed on the exposed surface of the bonding pads 214 and covering a portion area of the passivation layer 216 around the bonding pads 214.

A first patterned photoresist layer 220a is formed on the wafer 210 by a first photolithography process, and the first patterned photoresist layer 220a includes a plurality of first openings 222a exposing the surface of the UBM layer 218. Next, referring to FIGS. 3B and 3C, a second patterned photoresist layer 220b is formed over the wafer 210. Thereafter, a plurality of second openings 222b which expose the first opening 222a of the first patterned photoresist layer 220a, is formed in the second patterned photoresist layer 220b by a second photolithography process. Moreover, the size of the second openings 222b is larger than that of the first openings 222a.

Figure 3D:
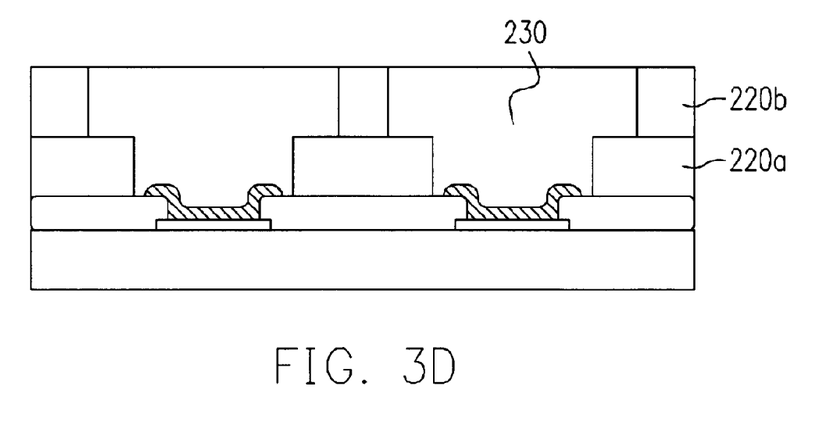
Figure 3E:
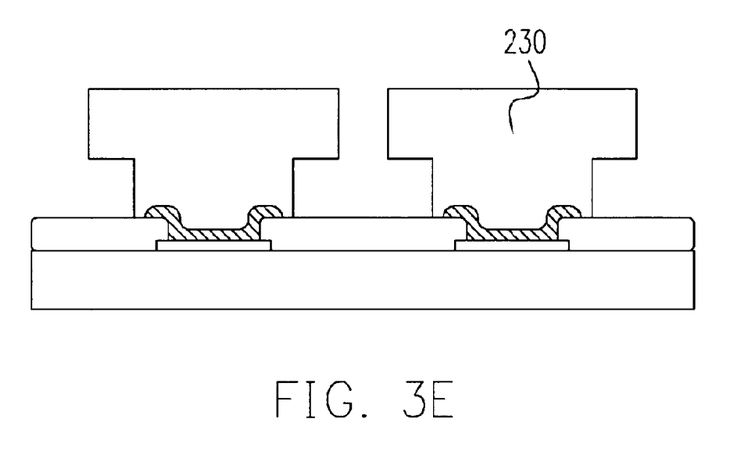
Figure 3F:
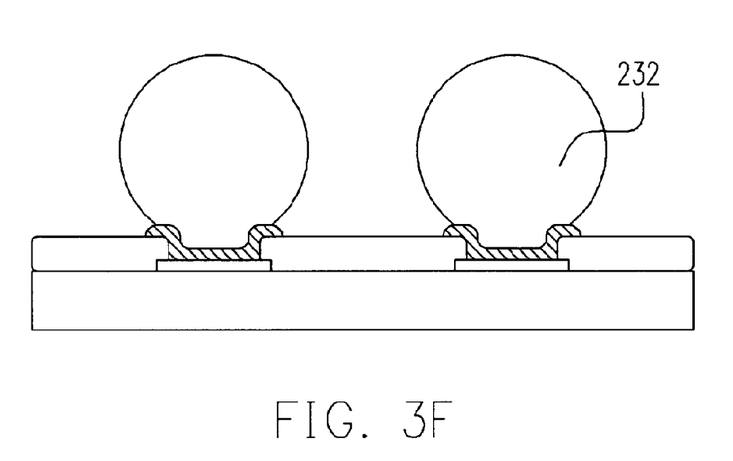

Referring to FIGS. 3D to 3F, a solder material is filled into the first opening 222a and the second opening 222b by, for example, stencil printing so as to form a plurality of solder posts 230 therein. Then, the first patterned photoresist layer 220a and the second patterned photoresist layer 220b are removed. Finally, a reflow process is performed to turn the solder posts 230 to spherical bumps 232.

In view of the above, the stair-shaped opening formed by the first and second patterned photoresist layers are fabricated via two separate photolithography processes, and the objective of increasing the height of the bump can be achieved by stacking two photoresist layers. However, performing two photolithography processes is not economical because not only the complexity and costs of production are increased but also the fabrication time is extended.

SUMMARY OF INVENTION

The present invention provides a bumping process by forming stair-shaped openings in the photoresist layer without using one extra photolithography process. Hence, the bump height can be increased, and the bonding between the chip and the carrier becomes more reliable.

As embodied and broadly described herein, the invention provides a bumping process. First, a wafer having a plurality of bonding pads and a passivation layer thereon is provided, and the bonding pads are exposed by the passivation layer. An UBM layer is formed on the bonding pads. A first photoresist layer is formed over the wafer and covers the bonding pads and the passivation layer. A second photoresist layer is formed on the first photoresist layer. The first and second photoresist layers have different exposure/development characteristics. A single exposure process is performed to form a plurality of first openings in the first photoresist layer and a plurality of second openings in the second photoresist layer simultaneously, so as to obtain a plurality of stair-shaped openings constructed by the first openings and the corresponding second openings. The UBM layer on the bonding pads is exposed by the stair-shaped openings. A solder material is filled into the stair-shaped openings to form a plurality of solder posts. The first photoresist layer and the second photoresist layer are then removed.

In addition, after the first photoresist layer and the second photoresist layer are removed, a reflow step can be performed to form a solder bump above each of the bonding pads. In accordance with one embodiment of the present invention, the first opening, for instance, is smaller than the second opening. The first photoresist layer, for instance, has a lower photosensitivity and a slower development rate. The second photoresist layer, for instance, has a higher photosensitivity and a faster development rate. In accordance with one embodiment of the present invention, the first photoresist layer and the second photoresist layer, for instance, are spin-coated photoresist layers or dry films. In addition, the solder material, for example, can be filled into the openings by stencil printing or electroplating.

As embodied and broadly described herein, the present invention provides a bumping process for forming higher bumps. After providing a wafer having a plurality of bonding pads and a passivation layer and forming an UBM layer on the bonding pads exposed by the passivation layer, a plurality of photoresist layers is formed over the wafer to cover the bonding pads and the passivation layers. Because the photoresist layers have different exposures/development characteristics, a plurality of stair-shaped openings located above the bonding pads and in the photoresist layers can be formed by a single exposure process. A solder material is filled into the stair-shaped openings to form a plurality of solder posts. Then, the photoresist layers are removed.

Furthermore, after the photoresist layers are removed, a reflow process is performed to form a solder bump above each of the bonding pads. In accordance with another embodiment of this invention, the photoresist layer that is farthest away from the bonding pads, for instance, has the highest photosensitivity and the fastest development rate, while the photoresist layer that is closest to the bonding pads, for instance, has the lowest photosensitivity and the slowest development rate. In accordance with another embodiment of the present invention, the photoresist layers can be, for instance, spin-coated photoresist layers or dry films. Besides, the solder material can be filled, for example, by stencil printing or electroplating.

In accordance with one embodiment of the present invention, the stair-shaped openings are formed in the multiple photoresist layers, and the solder posts are filled in the stair-shaped openings respectively. Therefore, compared with the conventional bumping process, bumps with a higher height are obtained. Furthermore, in the process of forming stair-shaped openings, only a single exposure process is needed. Thus, in accordance with the bumping process of the present invention, the electrical and mechanical connection between the chip and the carrier are more reliable. Moreover, the cost is lower, and fabrication time of the bumping process due to multiple exposure processes is saved.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve the principles of the invention.

DETAILED DESCRIPTION

Reference will now be made in detail of the present embodiments of the invention, examples of which are illustrated in the accompanying drawings. Wherever possible, the same reference numbers are used in the drawings and the description to refer to the same or like parts.

The First Embodiment

FIGS. 4A to 4F are schematic cross-sectional views of a bumping process in accordance with the first embodiment of the present invention. First, referring to FIG. 4A, a wafer 310 having, for example, a plurality of bonding pads 314 and a passivation layer 316 thereon for the protection of the wafer 310. The bonding pads 314 are exposed by the passivation layer 316. In addition, each bonding pad 314, for instance, is provided with an under bump metallurgy (UBM) layer 318 formed thereon. The process of forming the UBM layer 318 comprises forming at least a metal layer by sputtering or evaporation, for example, and then patterning the metal layer. The under bump metallurgy layer 318, for example, consists of three layers, i.e., an adhesion layer/a barrier layer/a wetting layer. The adhesion layer enhances bonding between the UBM layer 318 and the bonding pad 314. The barrier layer can act to prevent mobile ions from penetrating the UBM layer 318 and dispersing to the wafer 310. The wetting layer is employed to enhance the bonding between the UBM layer 318 and the solder material subsequently formed thereon. The material for the UBM layer 318, for instance, can be Ti/NiV alloy/copper, Al/NiV alloy/copper or other combinations or compositions that can achieve the above objectives.

Figure 4A:
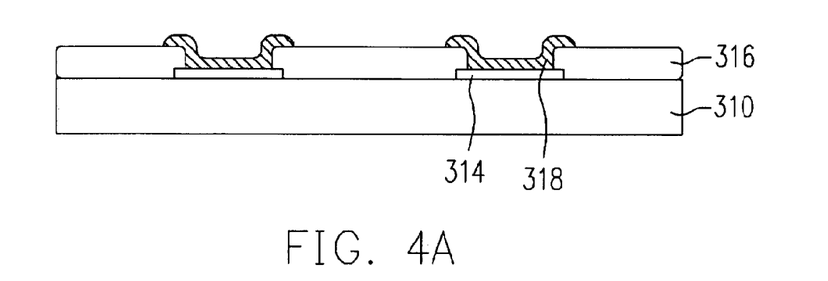
FIGS. 4A to 4F are schematic cross-sectional views of a bumping process in accordance with the first preferred embodiment of the present invention.
Figure 4B:
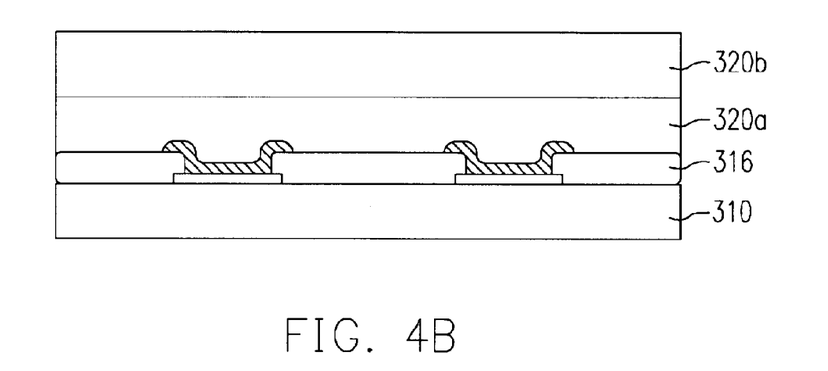

Next, referring to FIG. 4B, a first photoresist layer 320$a$ is formed over the wafer 310 and covers the UBM layer 318 and the passivation layer 316. After that, a second photoresist layer 320b is formed on the first photoresist layer 320a. The first and second photoresist layers 320a/320b can be formed, for example, by spin-coating a liquid state photoresist and soft baking, or by dry film adhesion. For example, the first photoresist layer 320a has a lower photosensitivity and hence less removal during the development (a slower development rate), while the second photoresist layer 320b has a higher photosensitivity and hence more removal during the development (a faster development rate).

Figure 4C:
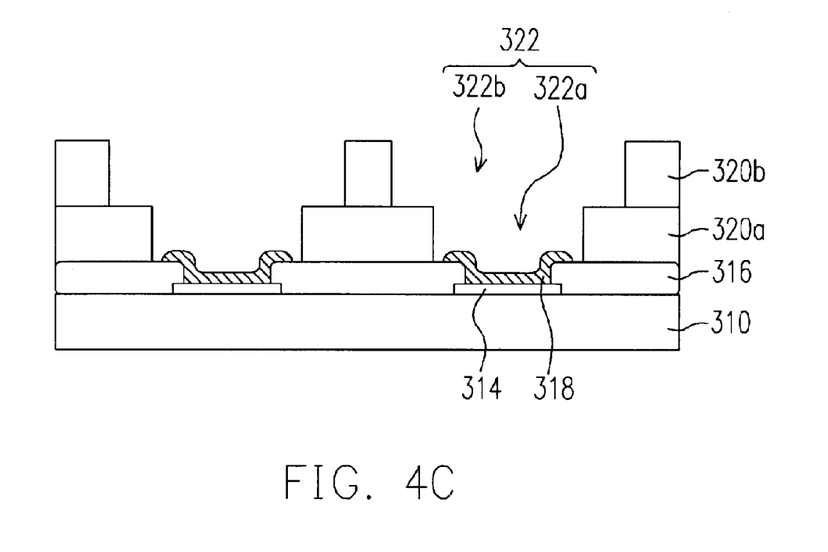

Referring to FIG. 4C, a single photolithography process is performed to the first photoresist layer 320a and the second photoresist layer 320b so as to form a plurality of first openings 322a and a plurality of second openings 322b respectively within the first photoresist layer 320a and the second photoresist layer 320b. Each of the first openings 322a, for instance, exposes the UBM layer 318. Each of the second openings 322b, for instance, is disposed above each of the first opening 322a and the first and second openings 322a/322b form a stair-shaped opening 322. The first photoresist layer 320a and the second photoresist layer 320b, for instance, are subjected to a single photolithography process by using a photomask (not shown). However, because the first photoresist layer 320a, for instance, has a lower photosensitivity and a slower development rate, and a second photoresist layer 320b has a higher photosensitivity and development rate, thus, under similar exposure conditions, the size of the second openings 322b is larger than that of the first openings 322a.

Figure 4D:
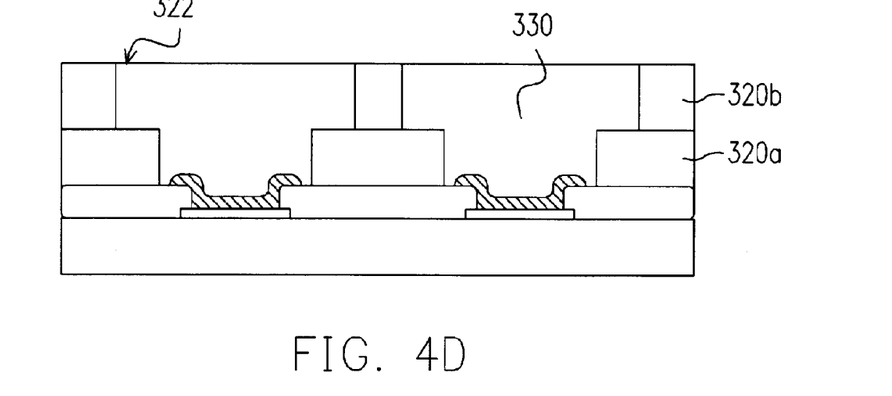
Figure 4E:
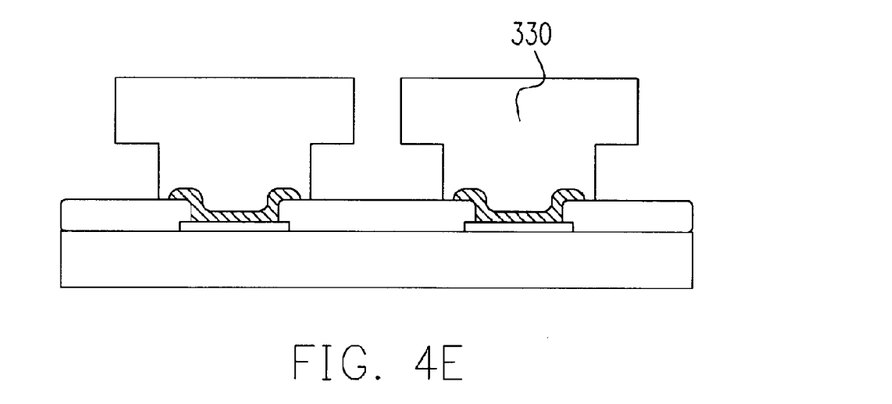
Figure 4F:
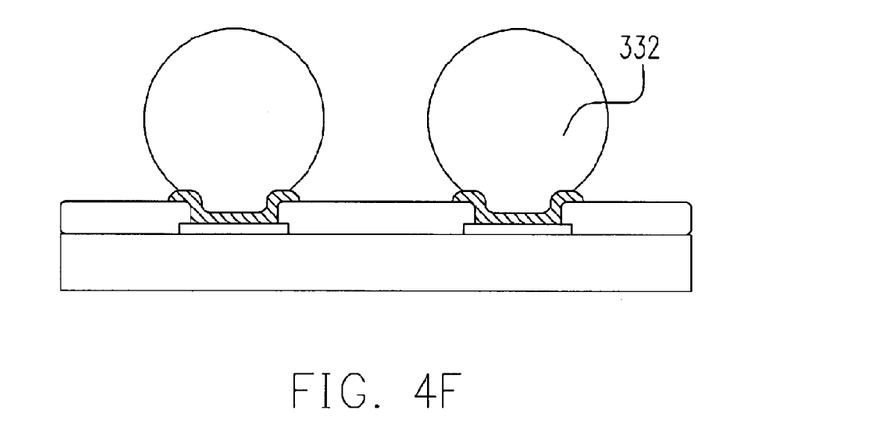

Next, referring to FIGS. 4D to 4F, the solder material is filled into each of the stair-shaped opening 322 by stencil printing, for example and a plurality of solder posts 330 are formed in the stair-shaped openings 322. It is obvious to those skilled in the art by making reference to the disclosure of the present invention that the filling of the solder material can be achieved by electroplating or other available methods, as long as the sequence of the step for patterning the metal layer into UBM layer 318 is adjusted. The method of filling the solder material does not affect the characteristic of the stair-shaped openings and therefore further discussion on this issue is omitted. After filling of the solder material into the stair-shaped openings, the remaining first photoresist layer 320a and the second photoresist layer 320b are stripped off. Finally, the solder posts 330 are subjected to a reflow process so as to turn the solder posts on each UBM layer 318 into a ball-shaped or spherical bumps 332. The reflow process, for example, includes IR radiation, hot wind convection current, etc.

The material for the solder posts 330 of the present invention, for example, can be SnPb alloy, high Pb-content material, SnAgCu alloy, SnAg alloy or leadless solder, etc.

The Second Embodiment

Figure 5A:
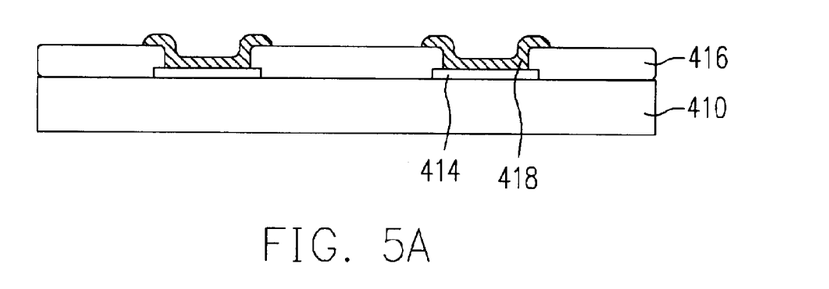
FIGS. 5A to 5F are schematic cross-sectional views of a bumping process in accordance with the second preferred embodiment of the present invention.

The second embodiment of the present invention discloses a method to obtain bumps with the higher height. FIGS. 5A to 5F are schematic cross-sectional views of a bumping process in accordance with the second embodiment of the present invention. Referring first to FIG. 5A, a wafer 410 is provided with a plurality of bonding pads 414, and a passivation layer 416 thereon for the protection of the wafer 410. The bonding pads 414 are exposed by the passivation layer 416. For each bonding pad 414, an under-bump-metallurgy (UBM) layer 418 is formed on the bonding pad 414.

Figure 5B:
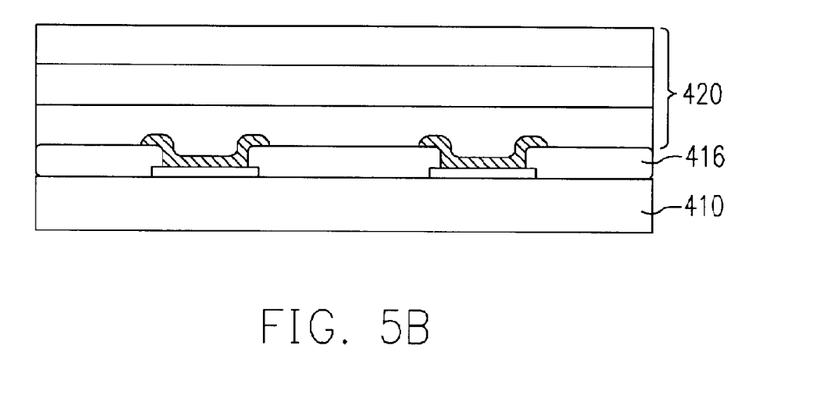

Referring to FIG. 5B, a plurality of photoresist layers 420 is formed over the wafer 410 and covers the UBM layer 418 and the passivation layer 416. Among the photoresist layers 420, the topmost photoresist layer 420 (i.e., farthest away from the bonding pad 414), for instance, has the highest photosensitivity and the fastest development rate, while the bottommost photoresist layer (i.e., closest to or directly on the bonding pad 414), for example, has the lowest photosensitivity and the slowest development rate.

Figure 5C:
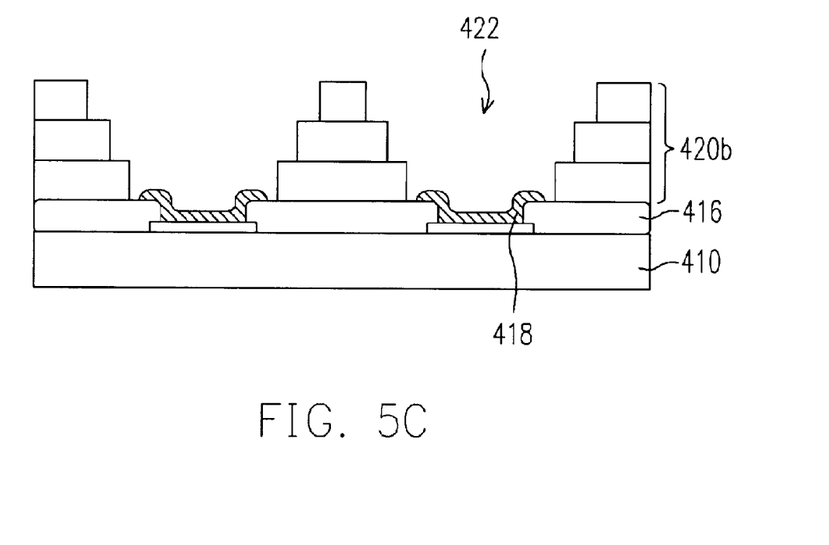

Next, referring to FIG. 5C, a single photolithography process is performed to the photoresist layers 420 on the UBM layer 418so as to form the patterned photoresist layer 420b with a plurality of stair-shaped openings 422. The stair-shaped openings 422, for example, expose the UBM layer 418. All the photoresist layers 420, for example, are subjected to a single photolithography process using one photomask (not shown). Because each of the photoresist layers 420 has different photosensitivity and development rates, even under the same exposure conditions, the size of the openings formed within each photoresist layer is different to one another, and stair-shaped openings 422 are thus formed.

Figure 5D:
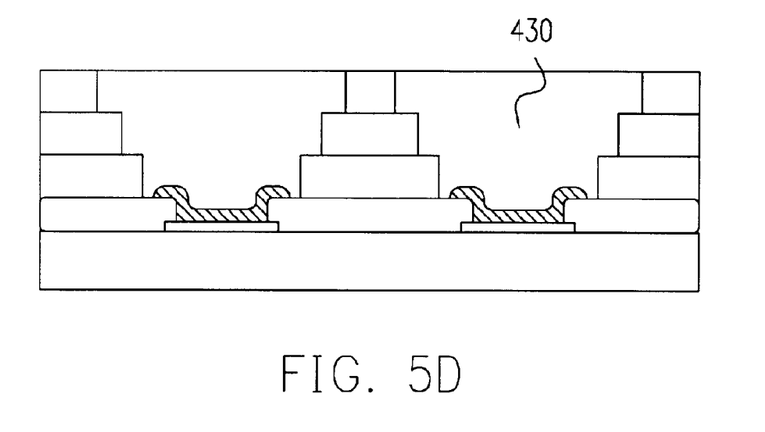
Figure 5E:
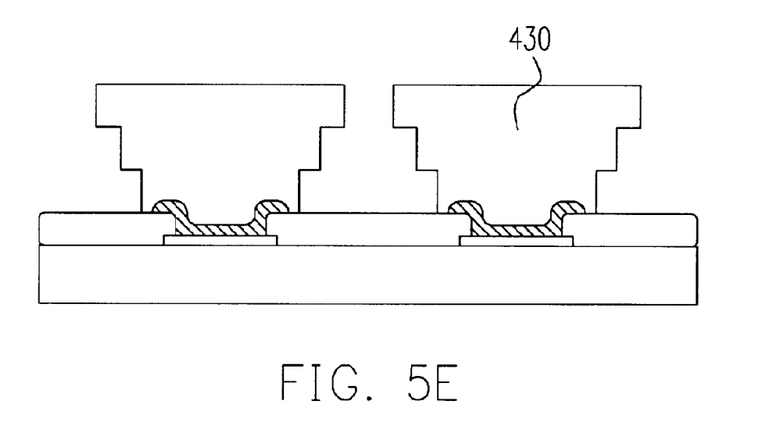
Figure 5F:
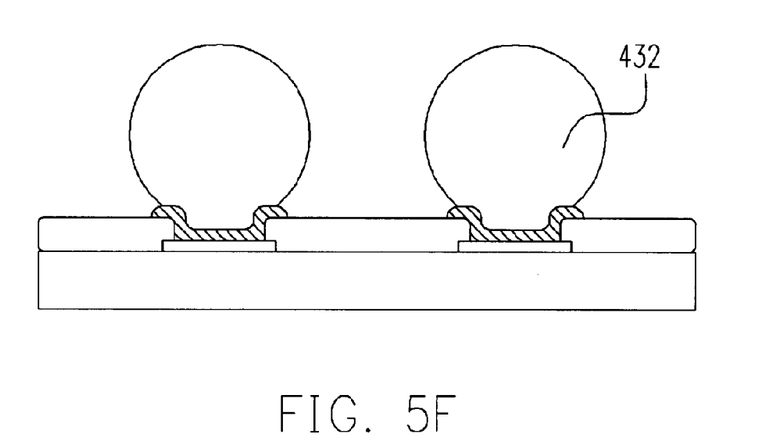

Next, referring to FIGS. 5D to 5F, a plurality of solder posts 430 are formed within the stair-shaped openings 422. After that, the remaining photoresist layers 420 are stripped off. Finally, the solder posts 430 are subjected to a reflow process and turn into ball-shaped or spherical bumps 432 on the UBM layer 418.

In the second embodiment, due to the fact that a plurality of photoresist layers are employed, the height of the stair-shaped openings can be increased and the height of the bump is thus increased. The number of the photoresist layers is not restricted as described in the embodiments, and other appropriate fabrication processes can be selected.

In accordance with the present invention, a single exposure is used to form deeper stair-shaped openings (with larger volume) within the photoresist layers, which results in higher bumps as compared to the conventional bumping processes. Thus, as bumps are employed for mechanically and electrically connecting the chip(s) to the carrier using flip chip technology, a higher bump will reduce the shear stress on the bump caused by the thermal stress.

Thus, the bumping process in accordance with the present invention employing a single exposure process provides a high reliability of the connection between the chip(s) and the carrier, and at the same time, the production costs and fabrication time are reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bumping process, comprising:
   providing a wafer having a plurality of bonding pads and a passivation layer having a plurality openings thereon, wherein the bonding pads are exposed out of the openings of the passivation layer;
   forming an under-bump-metallurgy layer on the wafer and covering the bonding pads;
   forming a first photoresist layer over the wafer to cover the bonding pads and the passivation layer;
   forming a second photoresist layer on the first photoresist layer, wherein the first photoresist layer has exposure/development characteristics different from that of the second photoresist layer;
   performing a single exposure process to the first and second photoresist layers to form a plurality of first openings in the first photoresist layer and a plurality of second openings in the second photoresist layer simultaneously, wherein a plurality of stair-shaped openings are formed from the first openings and the second openings and expose the under-bump-metallurgy layer;

filling a solder material into the stair-shaped openings to form a plurality of solder posts; and removing the first photoresist layer and the second photoresist layer.

2. The bumping process of claim 1, further comprising reflowing the solder posts to form a plurality of bumps over the under-bump-metallurgy layer, after removing the first and second photoresist layers.

3. The bumping process of claim 1, wherein the first openings are smaller than the second openings.

4. The bumping process of claim 1, wherein the first photoresist layer has a photosensitivity lower than that of the second photoresist layer.

5. The bumping process of claim 1, wherein the first photoresist layer comprises a spin-coated photoresist or a dry film.

6. The bumping process of claim 1, wherein the second photoresist layer is a liquid state spin-coated photoresist or a dry film.

7. The bumping process of claim 1, wherein the method of filling the solder material comprises electroplating or stencil printing.

8. A bumping process, comprising:

providing a wafer having a plurality of bonding pads and a passivation layer having a plurality of openings thereon, wherein the bonding pads are exposed out of the openings of the passivation layer;

forming an under-bump-metallurgy layer on the wafer to cover the bonding pads;

forming a plurality of photoresist layers on the wafer to cover the bonding pads and the passivation layers, wherein the photoresist layers have different photosensitivities;

forming a plurality of stair-like openings located above the bonding pads in the photoresist layers by single exposure process, wherein the under-bump-metallurgy layer is exposed out of the stair-shaped openings;

filling a solder material into the stair-shaped openings to form a plurality of solder posts; and removing the photoresist layers.

9. The bumping process of claim 8, further comprising the step of reflowing the solder posts to form a plurality of bumps on the under-bump-metallurgy layer, after removing the photoresist layers.

10. The bumping process of claim 8, wherein a size of the stair-like openings in the lower photoresist layer that is closer to the bonding pads is smaller than that of the stair-shaped openings in the higher photoresist layer that is farther away from the bonding pads.

11. The bumping process of claim 8, wherein the photoresist layer that is farthest away from the bonding pads has the highest photosensitivity, while the photoresist layer that is closest to the bonding pads has the lowest photosensitivity.

12. The bumping process of claim 8, wherein the photoresist layers comprise a spin-coated photoresist.

13. The bumping process of claim 8, wherein the photoresist layers comprise a dry film.

14. The bumping process of claim 8, wherein the method of filling the solder material comprises electroplating or stencil printing.

* * * * *